United States Patent
Sapozhnikov et al.

(10) Patent No.: US 8,582,249 B2
(45) Date of Patent: Nov. 12, 2013

(54) MAGNETIC ELEMENT WITH REDUCED SHIELD-TO-SHIELD SPACING

(75) Inventors: Victor Boris Sapozhnikov, Minnetonka, MN (US); Eric Walter Singleton, Maple Plain, MN (US); Mark William Covington, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 140 days.

(21) Appl. No.: 13/094,530

(22) Filed: Apr. 26, 2011

(65) Prior Publication Data

US 2012/0276415 A1    Nov. 1, 2012

(51) Int. Cl.
*G11B 5/39* (2006.01)

(52) U.S. Cl.
USPC .......... 360/324.11; 360/324.12; 428/811; 428/811.5

(58) Field of Classification Search
None
See application file for complete search history.

(56) References Cited

U.S. PATENT DOCUMENTS

| | | | |
|---|---|---|---|
| 5,576,914 A | 11/1996 | Rottmayer et al. | |
| 5,696,656 A | 12/1997 | Gill et al. | |
| 6,721,139 B2 | 4/2004 | Gill | |
| 6,724,584 B2 | 4/2004 | Mack et al. | |
| 7,035,062 B1 | 4/2006 | Mao et al. | |
| 7,092,221 B2 * | 8/2006 | Gill | 360/324.11 |
| 7,382,589 B2 | 6/2008 | Lin et al. | |
| 7,522,392 B2 * | 4/2009 | Carey et al. | 360/324.2 |
| 7,570,461 B2 | 8/2009 | Sapozhnikov | |
| 7,616,411 B2 * | 11/2009 | Gill | 360/324.12 |
| 2002/0154452 A1 * | 10/2002 | Gill | 360/321 |
| 2003/0123198 A1 * | 7/2003 | Sugawara et al. | 360/314 |
| 2004/0061983 A1 * | 4/2004 | Childress et al. | 360/324.2 |
| 2005/0243474 A1 * | 11/2005 | Gill | 360/324.1 |
| 2008/0180863 A1 * | 7/2008 | Gill | 360/324.2 |
| 2009/0080125 A1 * | 3/2009 | Kondo | 360/324.12 |
| 2009/0086385 A1 * | 4/2009 | Gill et al. | 360/324.11 |
| 2012/0134057 A1 * | 5/2012 | Song et al. | 360/319 |

* cited by examiner

*Primary Examiner* — Kevin Bernatz
(74) *Attorney, Agent, or Firm* — Hall Estill Attorneys at Law

(57) ABSTRACT

A magnetic element has a magnetically responsive lamination with a ferromagnetic free layer separated from a synthetic antiferromagnetic (SAF) layer by a spacer layer and from a sensed data bit stored in an adjacent medium by an air bearing surface (ABS). The lamination is coupled to at least one antiferromagnetic (AFM) tab a predetermined offset distance from the ABS.

20 Claims, 5 Drawing Sheets

US 8,582,249 B2

MAGNETIC ELEMENT WITH REDUCED SHIELD-TO-SHIELD SPACING

SUMMARY

Various embodiments of the present invention are generally directed to a magnetic element capable of detecting changes in magnetic states.

In accordance with various embodiments, a magnetic element has a magnetically responsive lamination with a ferromagnetic free layer separated from a synthetic antiferromagnetic (SAF) layer by a spacer layer and from a sensed data bit stored in an adjacent medium by an air bearing surface (ABS). The lamination is coupled to at least one antiferromagnetic (AFM) tab a predetermined offset distance from the ABS.

DETAILED DESCRIPTION

The present disclosure generally relates to magnetic elements capable of detecting magnetic fluctuations, such as in the context of read sensors used in data transducing heads and magnetic memory elements used to provide non-volatile storage of data. The areal density of a data storage device has become more important as data storage capacity increases. Raising the areal density of a device corresponds to smaller reading components and more data bits for a given area. However, a reduction in the size of a data reader can lead to magnetic instability and inaccurate data sensing through the presence of noise and poor cross-track resolution.

Accordingly, various embodiments of the present invention are generally directed to a magnetically responsive lamination with a ferromagnetic free layer separated from a synthetic antiferromagnetic (SAF) layer by a spacer layer and from a sensed data bit stored in an adjacent medium by an air bearing surface (ABS). The lamination is coupled to at least one antiferromagnetic (AFM) tab a predetermined offset distance from the ABS. Such position of the AFM tab offset from an air bearing surface (ABS) can allow for a smaller shield-to-shield spacing which corresponds to increased areal density capability and accurate data sensing.

Figure 1:
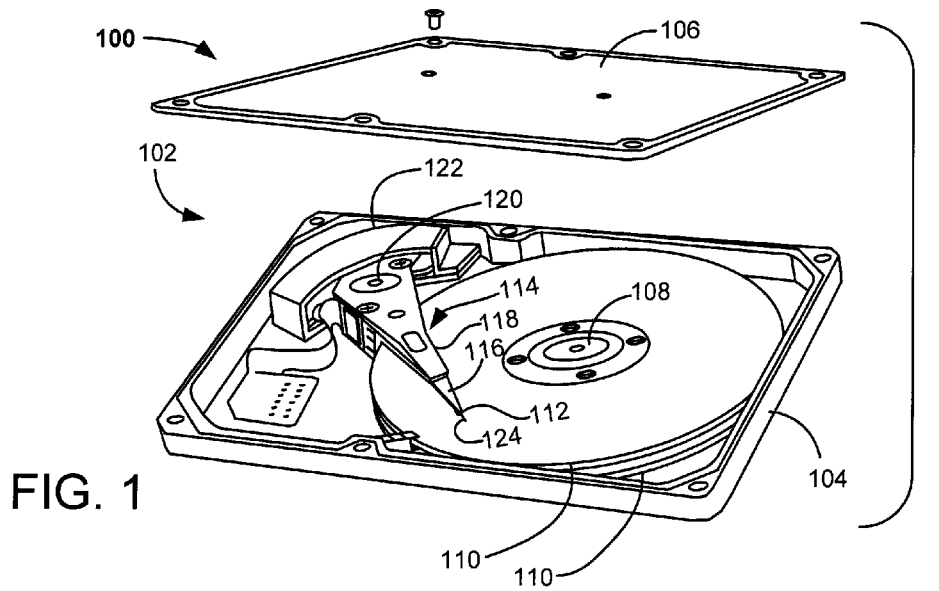
FIG. 1 is a perspective view of an embodiment of a data storage device.

An example of a data storage device 100 is provided in FIG. 1. The device 100 shows a non-limiting environment in which various embodiments of the present invention can be practiced. The device 100 includes a substantially sealed housing 102 formed from a base deck 104 and top cover 106. An internally disposed spindle motor 108 is configured to rotate a number of magnetic storage media 110. The media 110 are accessed by a corresponding array of data transducers (read/write heads) that are each supported by a head gimbal assembly (HGA) 112.

Each HGA 112 can be supported by a head-stack assembly 114 ("actuator") that includes a flexible suspension 116, which in turn is supported by a rigid actuator arm 118. The actuator 114 preferably pivots about a cartridge bearing assembly 120 through application of current to a voice coil motor (VCM) 122. In this way, controlled operation of the VCM 122 causes the transducers (numerically denoted at 124) to align with tracks (not shown) defined on the media surfaces to store data thereto or retrieve data therefrom.

Figure 2:
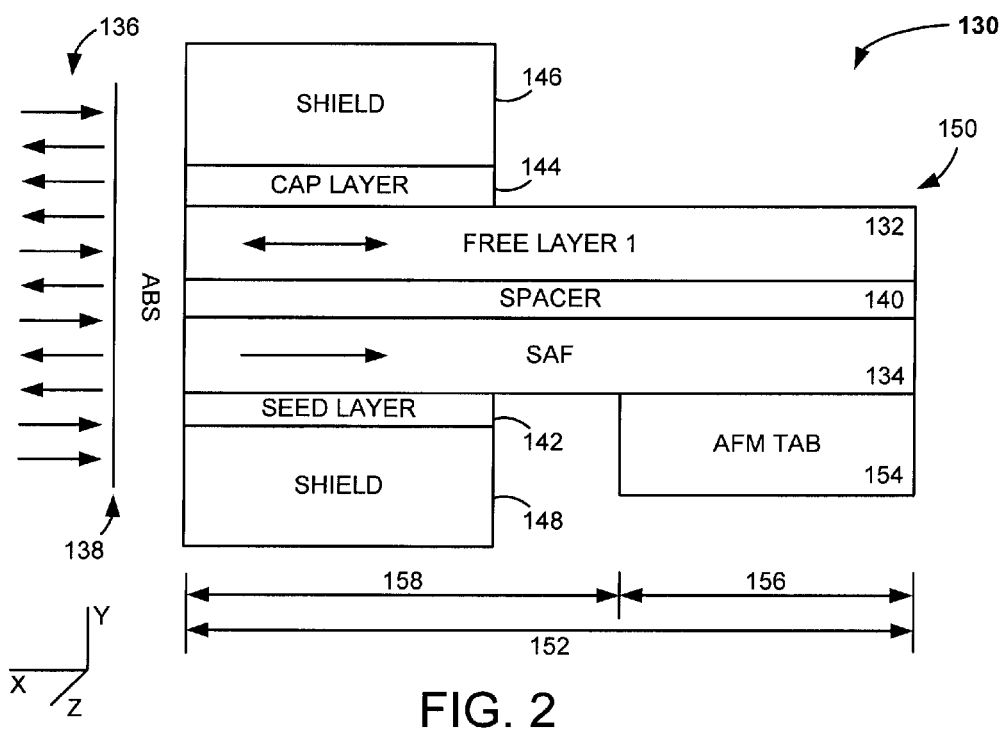
FIG. 2 generally illustrates an example of a magnetic element capable of being used as a read sensor in the data storage device of FIG. 1.

FIG. 2 displays an example of a block representation of a magnetic element 130 capable of being used as a read sensor in the data transducers 124 of FIG. 1. The element 130 includes a ferromagnetic free layer 132 that is sensitive to external magnetic fields. That is, the free layer 132 can have a magnetization that corresponds to an encountered external magnetic field, such as provided by programmed magnetic bits 136 on an adjacent data storage medium 138.

A synthetic antiferromagnetic (SAF) layer 134 that has a predetermined set magnetization is separated from the free layer 132 by a non-magnetic spacer layer 140 that can be constructed with a variety of thicknesses and materials to accommodate free layer magnetic sensing. The free layer 132 and SAF layer 134 can each be coupled to an electrode layer, such as seed layer 142 and cap layer 144 that provides both manufacturing and operational improvements. It should be noted, however, that the composition, shape, and placement of the electrode layers 142 and 144 are not limited and can be modified or removed.

The magnetic element 130 further includes shield layers 146 and 148 attached to the electrode layers on opposite sides of the free layer 132 and SAF layer 134, respectively. The shield layers 146 and 148 can be oriented in a variety of configurations and compositions to direct unwanted magnetic flux away from the magnetic lamination of the free and SAF layers 132 and 134. Such shielding can allow for improved magnetic sensing of programmed bits 136 from medium 138 by eliminating noise and inadvertent sensing of adjacent bits.

As shown in FIG. 2, the magnetic lamination is a magnetic stack 150 made up of the spacer 140, SAF 134, and ferromagnetic free 132 layers that each has an elongated stripe height 152 that provides enhanced anisotropic properties that can increase magnetic stability and sensing. Still, the set magnetization of the SAF layer 134 can be unstable despite the elongated stripe height 152, which leads to inaccurate data bit 136 sensing. Attaching an antiferromagnetic (AFM) tab 154 to the SAF layer 134 can provide added magnetic stability through exchange coupling that maintains the set magnetization of the SAF layer 134 in response to external magnetic fields.

While the AFM tab 154 can be attached anywhere along the SAF layer 134, the addition of an AFM at the ABS would increase the distance between the shields 146 and 148 (shield-to-shield spacing) which limits the maximum potential areal density readable by the element 130. It has been observed that the AFM tab 152 can provide acceptable levels of exchange coupling to maintain the set magnetization of the SAF layer 134 with a length 156 that is less than the stripe height 152. Such decreased length 156 allows the AFM tab 154 to be placed at a predetermined offset distance 158 from the ABS, hence not increasing the shield-to-shield spacing at the air bearing surface (ABS) while providing enhanced magnetic stability to the element 130.

The addition of the AFM tab 154 to the magnetic stack 148 can provide increased performance with robustness against operational variability. The fact that the AFM tab 154 is complementing the existing set magnetization of the SAF layer 134 allows for the reduced tab length 156 to complement the SAF layer 134 without having to impart and maintain the set magnetization in response to the external bits 136. As such, the AFM tab 154 needs to be coupled directly to the SAF layer 134, as opposed to attaching the tab 154 onto the free layer 132 which would impart a bias magnetization onto the free layer 132.

In FIG. 2, the shields 146 and 148 are proximal to the ABS, which can provide adequate shielding of data bits 136 that lay outside a predetermined data track (not shown). However, as displayed in the magnetic element 160 of FIG. 3, the shields 162 and 164 can be extended away from the ABS, along the X axis, to have a stripe height that is equal to or greater than the stripe height of the magnetic stack 166. Similarly to the magnetic lamination 150 of FIG. 2, the magnetic stack 166 is constructed with a non-magnetic spacer layers 168 disposed between the top shield 164, a ferromagnetic free layer 170, a SAF layer 172, and the bottom shield 162.

The SAF layer 172 can be configured as a variety of different materials, none of which are required or limited, but in some embodiments the SAF layer 172 is a lamination of a transition metal, such as Ru, disposed between ferromagnetic amorphous sub-layers, such as metals like Ni and Co, alloys like CoFe and NiFe, and high polarization ratio compounds like CoFeB. The SAF layer 172 has an AFM tab 174 attached directly to one of the ferromagnetic sub-layers to aid in pinning the sub-layer to the predetermined set magnetization, although such direct attachment can have an intervening non-magnetic seed layer in some embodiments.

The AFM tab 174 is partially surrounded by the bottom shield 162 which can provide further deflection of errant magnetic fields from adversely affecting the AFM tab 174, SAF layer 172, and stack 166. As shown, the bottom shield 162 has an area of reduced thickness feature (i.e. notch) in which the AFM tab 174 resides, as opposed to the top shield 164 that has a continuous thickness along its entire stripe height. Nevertheless, the shape, size, and configuration of one or more features are not limited and can be modified between top and bottom shields 162 and 164. For example, the reduced thickness feature of the bottom shield 162 may have tapered sidewalls instead of the orthogonal sidewalls displayed in FIG. 3.

Figure 3:
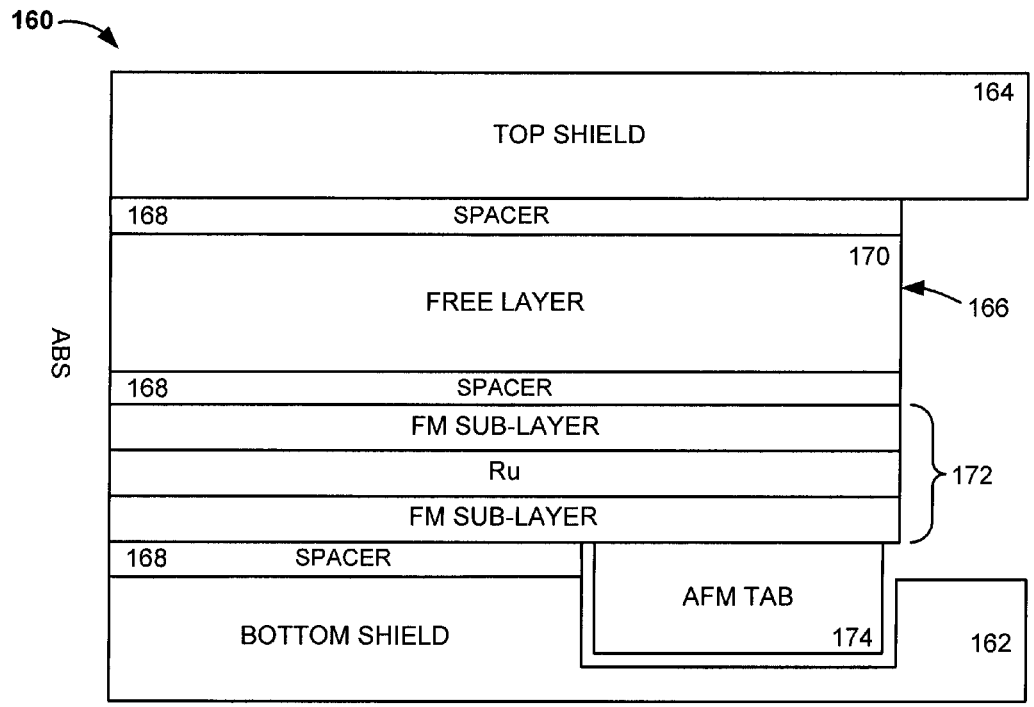
FIG. 3 shows a magnetic element constructed and operated in accordance with various embodiments of the present invention.
Figure 4:
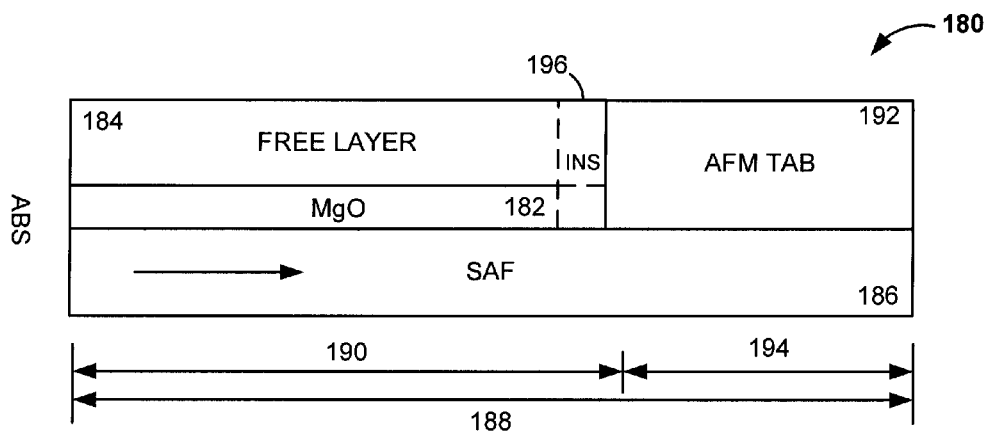
FIG. 4 displays a magnetic stack capable of being used in the magnetic elements of FIGS. 2 and 3 in accordance with various embodiments of the present invention.

FIG. 4 generally illustrates an embodiment of a magnetic stack 180 that can be used in the magnetic elements 130 and 160 of FIGS. 2 and 3 in accordance with various embodiments. The stack 180 has an MgO tunnel junction 182, which can contribute to producing tunnel magnetoresistance (TMR) by having a reduced thickness that brings the free layer 184 closer to the SAF layer 186. As configured, the SAF layer 186 has a full stripe height 188 while the junction 182 and free layer 184 each have a reduced stripe height 190 that corresponds to a predetermined offset distance that the AFM tab 192 is away from the ABS.

The position of the AFM tab 192 laterally adjacent to the free layer 184 allows for direct attachment to the SAF layer 186 while not adding any thickness to the magnetic stack 180, in contrast to the protruding AFM tabs of FIGS. 2 and 3. The AFM tab 192 is constructed with a length 194 that can be adjusted to provide enhanced magnetic responsiveness by the free layer 184 in relation to a data bit, such as bit 136 of FIG. 2. The free layer 184 can be optionally buffered from direct contact with the AFM tab 192 by an insulating feature (INS) 196 that allows the free layer 184 to freely respond to magnetic fields without any bias magnetization leaking to the free layer 184 from the AFM tab 192.

Figure 5:
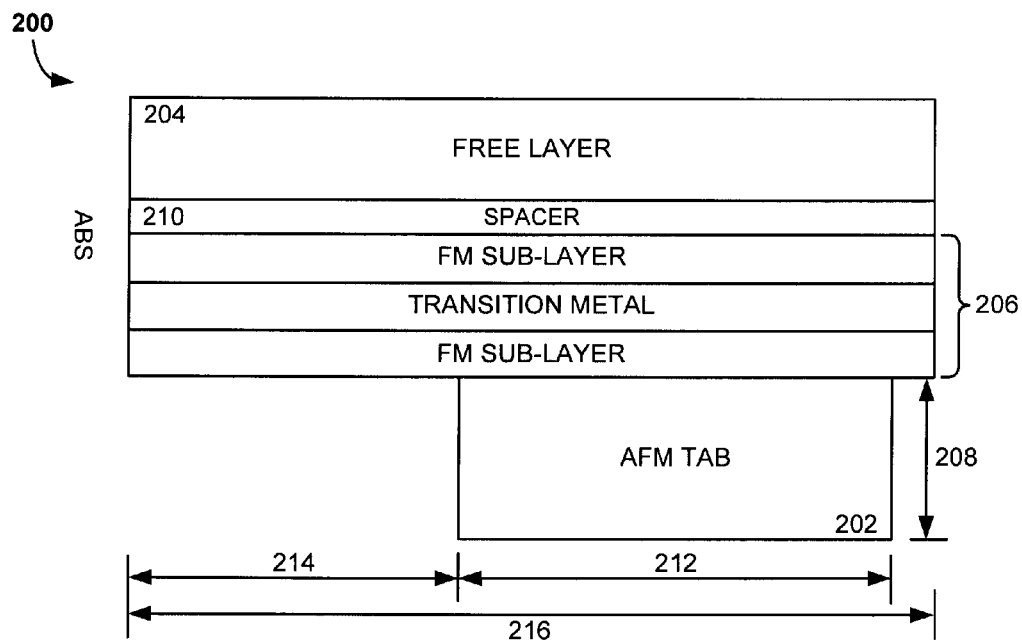
FIG. 5 provides an embodiment of a magnetic stack capable of being used in the magnetic elements of FIGS. 2 and 3.

While the AFM tab 192 can be incorporated into the stack 180 to make a continuous thickness throughout the stripe height 188, the tab 192 can have a different thickness than the free layer 184 if positioned as an appendage of the magnetic stack 180. FIG. 5 displays an example of a magnetic stack 200 where the thickness of the AFM tab 202 is greater than the thickness of the free layer 204. In FIG. 5, the AFM tab 202 is attached on the SAF layer 206 opposite the free layer 204 and has a thickness 208 that is greater than the thickness of the SAF 206, non-magnetic spacer 210, or free layer 204, respectively. Such increased thickness 208 can generate a stronger exchange coupling for use in maintaining the predetermined set magnetization of the SAF layer 206.

The AFM tab 202 can also be manipulated in various positions and lengths to vary the strength of the exchange coupling provided to the SAF layer 206. The tab 202 can have an extended length 212 that is offset from the ABS by a distance 214 that is less than the extended length 214, but does not extend to the rear boundary of the SAF layer 206. That is, the offset distance 214 is less than the length 212 of the tab 202 that does not extend to the rear extent of the stripe height 216 of the SAF 206, free layer 204, and spacer 210. By positioning the AFM tab 202 inside the stripe height 216 of the SAF 206, the exchange coupling can be varied and the exchange coupling of the AFM tab 202 can be tuned.

Figure 6:
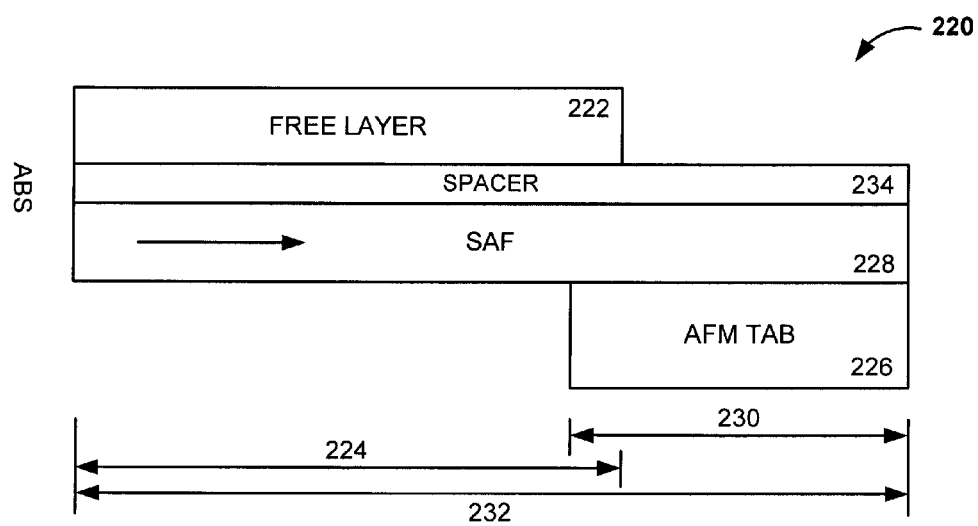
FIG. 6 shows an example of a magnetic stack capable of being used in the magnetic elements of FIGS. 2 and 3.

As can be appreciated, the operational characteristics of the magnetic stack can be adjusted and tuned by varying the size, shape, and position of the AFM tab on the SAF. In some embodiments, the AFM tab is configured to provide increased exchange coupling, as in FIG. 5. However, the free layer can also be modified to increase the effectiveness of the exchange coupling imparted on the SAF by the AFM tab. FIG. 6 displays such an embodiment of a magnetic stack 220 configuration. As opposed to the increased thickness of the AFM tab in FIG. 5, the free layer 222 has a reduced stripe height 224, which reduces the magnetization strength of the free layer 222 and effectively increases the influence of the exchange coupling of the AFM tab 226 on the SAF layer 228.

As shown in FIG. 6, the AFM tab 226 has a length 230 that overlaps with the free layer 222 stripe height 224. The ability to provide such an overlap with the configuration of stack 220 contrasts the AFM tab length capability in stack 180 of FIG. 4, where the AFM tab 192 is laterally adjacent the free layer 184. Thus, attaching the AFM tab 226 on the opposite side of the SAF layer 228 from the free layer 222 allows a wider range of tab 226 configurations at the cost of an increased stack thickness distal to the ABS. The AFM tab 226 could be constructed, in a non-limiting embodiment, with a tapered sidewall that reduces the thickness of the tab 226 over the entire stripe height 232 of the SAF layer 228.

In various other embodiments, the stack 220 configures the spacer layer 234 with a reduced thickness, as compared to spacer layer 140 of FIG. 2. A reduced thickness can increase the influence of the set magnetization of the SAF layer 228 on the free layer 22 and may allow the AFM tab 226 to have a smaller areal extent in response to a decreased SAF layer 228 magnetization strength. The position of the AFM tab 226 opposite the free layer 222 further contributes to a reduction in noise due to the decoupling of the optimization of the free layer 222 in relation to the SAF layer 228.

Figure 7:
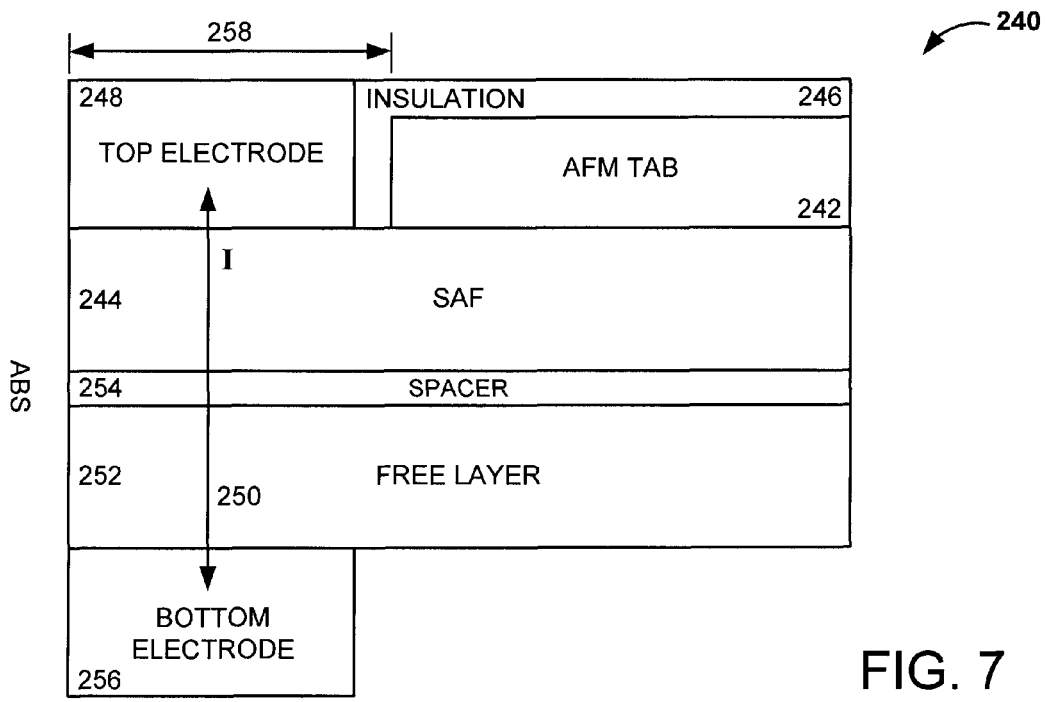
FIG. 7 displays an embodiment of a magnetic stack capable of being used in the magnetic elements of FIGS. 2 and 3.

However, in some circumstances, larger exchange coupling and AFM tab size is used to strongly influence the set magnetization of the SAF layer. FIG. 7 generally illustrates an embodiment of a magnetic stack 240 that has an AFM tab 242 with an increased areal extent. That is, the AFM tab 242 has a greater surface area contact with the SAF layer 244, which corresponds to increased exchange coupling. With the stronger magnetization of the AFM tab 242 and SAF layer 244, an insulating layer 246 can be constructed around the tab 242 to protect from any inadvertent magnetic shorts between the tab 242 and the top electrode layer 248 that directs a current (I) 250 through the stack 240 to transmit sensed data to a host.

The top electrode layer 248, as displayed, can have an increased thickness that is greater than the AFM tab 242 and equal to the combined thickness of the tab 242 and insulation layer 246. The increased thickness of the top electrode layer 248 can provide a stable conductive pathway for the current 250 to pass through the free layer 252, spacer 254, and SAF layer 244 without being influenced by the increased set magnetization of the SAF layer 244. In other words, the thicker top electrode 248 ensures the current 250 passes through the stack 240 without being altered by the magnetization of the AFM tab 242 or SAF layer 244.

The stack 240 can further be configured with a bottom electrode layer 256 that has a thickness that is equal to or less than the top electrode layer 248. While a thicker bottom electrode layer 256 can aid in the stability of the current 250 passing through the stack 240, constructing the bottom electrode layer 256 with a reduced thickness can provide a smaller shield-to-shield spacing. The configuration of a thicker bottom electrode layer 256 can further have an extended stripe height that combines with an insulating layer (not shown) to result in a continuous bottom surface of the stack 240 that matches the continuous top surface shown in FIG. 7.

Regardless of the various configurations of the AFM tab 242, top electrode layer 248, bottom electrode layer 256, and insulation 246, the stack 240 has enhanced stability due to the attachment of the AFM tab 242 to the SAF layer 244 while having a minimal shield-to-shield spacing due to the tab 242 being placed an offset distance 258 from the ABS. Even with the electrode layers 248 and 256 adding thickness to the stack 240, the recessed positioning of the AFM tab 242 reduces the overall thickness of the stack 240 in relation to other configurations where an AFM layer is present at the ABS.

Figure 8:
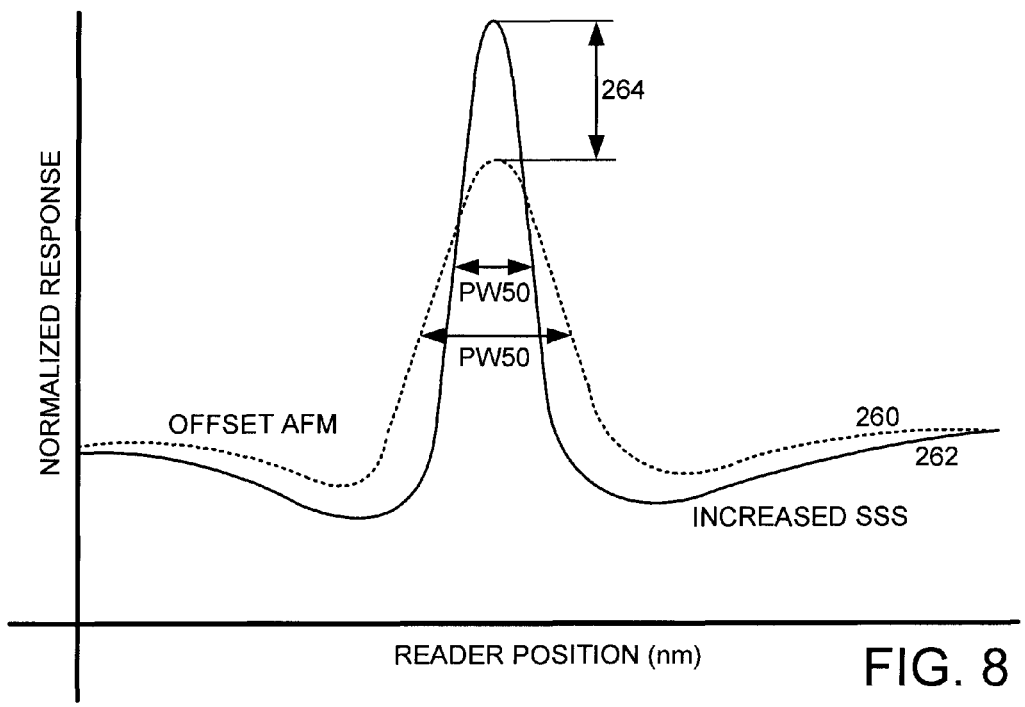
FIG. 8 generally illustrates operational characteristics of a magnetic element constructed and operated in accordance with various embodiments of the present invention.

FIG. 8 graphs a normalized response for an embodiment of a magnetic element employing an AFM tab positioned an offset distance from the ABS in comparison to an element constructed with a wider shield-to shield spacing. As a magnetic element encounters a programmed data bit, such as bit 136 of FIG. 2, a pulse is produced with a measurable pulse width. As can be appreciated, the pulse width of a magnetic element at 50% of the pulse amplitude (PW50) is indicative of the spatial resolution of the element.

As measured, the dependence of a magnetic element's PW50 on shield-to-shield spacing (SSS) is expressed by equation 1:

$$\Delta PW50 = 0.3(\Delta SSS) \quad \text{[Equation 1]}$$

With a reduction in the PW50, the magnetic element is capable of greater linear and areal density of data bits, due in part to enhanced down-track resolution of the element.

The graph of FIG. 8 provides PW50 operational characteristics of an element with an offset AFM, as represented by segmented line 260, in relation to an element with an increased SSS, displayed as solid line 262. The response to a data bit for each element is similar, but distinguished by the amplitude and PW50 width. For the offset AFM element 260, a low amplitude and narrower PW50 is experienced in relation to the increased SSS element 262. The difference in amplitude 264 of the shields in combination with a narrower PW50 supports the magnetic stability and enhanced operational characteristics of the offset AFM element versus an element with wider SSS.

The differences between the offset AFM element 260 and the wider SSS element 262 illustrate the operational results of configuring the AFM tab away from the ABS. As such, an element can be constructed with a relatively thin AFM on the ABS, but such configuration may not provide the high amplitude with narrow PW50 no matter how thin the AFM is constructed.

Figure 9:
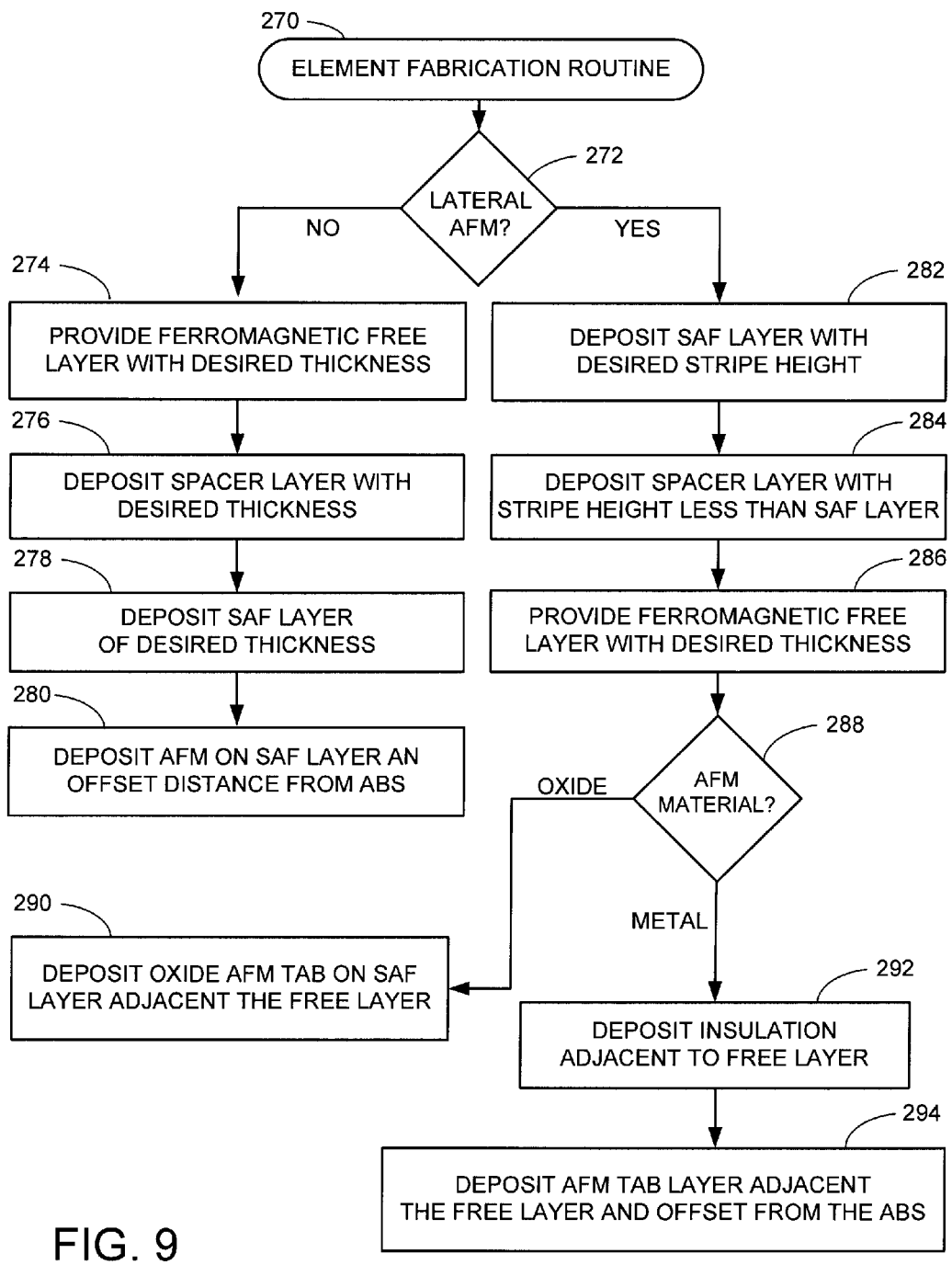
FIG. 9 provides a flowchart of an element fabrication routine carried out in accordance with various embodiments of the present invention.

FIG. 9 provides an example of an element fabrication routine 270 conducted in accordance with various embodiments of the present invention. Initially, the routine 270 determines in decision 272 if a lateral antiferromagnetic (AFM) layer is to be used, as generally illustrated in FIG. 4. The decision 272 evaluates whether or not a ferromagnetic free layer is to laterally combine with an AFM layer to occupy a predetermined stripe height.

A decision not to use a lateral AFM leads the routine 270 to step 274 where a ferromagnetic free layer is deposited with a predetermined thickness and extended stripe height that promotes anisotropic magnetic stability. The free layer may or may not be deposited on a substrate, such as the seed layer 142 of FIG. 2, with various deposition techniques such as, but not limited to, physical vapor deposition (PVD), chemical vapor deposition (CVD), and sputtering.

A spacer layer is then deposited in step 276 with a predetermined thickness onto the free layer. Next in step 278, a synthetic antiferromagnetic (SAF) layer is deposited with a predetermined thickness onto the spacer layer. In some embodiments, the SAF layer, spacer, and free layer have the same stripe height, but such configuration is not required, as illustrated in FIG. 6. With the SAF layer deposited, step 280 deposits an AFM tab onto the SAF layer a predetermined offset distance from an air bearing surface of the element. The AFM tab is constructed with a predetermined length, thickness, and position on the SAF layer to produce a predetermined amount of exchange coupling.

Returning to decision 272, if a lateral AFM is needed, step 282 deposits a SAF layer with a predetermined stripe height and subsequently deposits a spacer layer onto the SAF layer in step 284 with a stripe height that is less than the stripe height of the SAF layer. That is, the spacer layer is constructed so that a subsequently deposited AFM tab is in direct contact with the underlying SAF layer. Step 286 proceeds to deposit the ferromagnetic free layer with a predetermined thickness and a stripe height that matches the existing spacer layer. Thus, as the routine 270 reaches decision 288, the SAF layer has a first stripe height while the spacer and free layers each have a second stripe height.

In decision 288, the type of AFM material to be positioned lateral to the free and spacer layers is determined. The choice of an oxide AFM, such as NiO, leads to step 290 where an AFM tab is deposited to contact the free, spacer, and SAF layers by occupying the empty region defined by the difference in stripe heights between the SAF and free layers. With a decision to use a metal AFM, such as IrMn, PtMn, or FeMn, an added step 292 deposits insulation material laterally adjacent to the free and spacer layers prior to step 294 depositing the metallic AFM tab in the remaining empty space on top of the SAF layer.

It should be noted that the various stripe height configurations can be done with a variety of different processes, none of which are required or limited. For example, basic mask and etching techniques can be used to construct the SAF and free layers with different stripe heights. Meanwhile, the AFM tab may be deposited after a self-aligned anisotropic etch on the SAF layer to prepare the surface for adhesion. However, it should be noted that none of the steps of routine 270 are required, and can be individually modified, relocated, and removed, at will.

As discussed above, the AFM tab can be positioned and sized in a variety of manners to tune the amount of exchange coupling provided to the SAF layer. Also discussed above but repeated here for clarity, the SAF layer can be a lamination of various materials, such as transitions metals and ferromagnetic free sub-layers, with common or varying thicknesses. As such, steps 278 and 284 can include the successive deposition of sub-layers that combine to act as a SAF lamination.

It can be appreciated that the configuration and material characteristics of the magnetic element described in the present disclosure allows for enhanced magnetic stability while providing a reduced shield-to-shield spacing. The combination of an extended stripe height of the SAF layer with an AFM tab that is offset from the ABS surface provides improved magnetic performance through noise reduction and enhanced stability. Moreover, the ability to tune the magnetic operating properties of the magnetic element through various size and positional adjustments of the AFM tab allow for a minimal element thickness while enhancing cross-track resolution and areal density capability. In addition, while the embodiments have been directed to magnetic sensing, it will be appreciated that the claimed invention can readily be utilized in any number of other applications, including data storage device applications.

It is to be understood that even though numerous characteristics and configurations of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. A magnetic head comprising:
   a magnetically responsive lamination with a uniform lamination thickness comprising a ferromagnetic free layer separated from a synthetic antiferromagnetic (SAF) layer by a spacer layer and from a sensed data bit stored in an adjacent medium by an air bearing surface (ABS); and
   at least one antiferromagnetic (AFM) tab incorporated into the magnetically responsive lamination and uniform lamination thickness, the AFM tab directly coupled to the SAF a predetermined offset distance from the ABS and separated from an electrode by an insulating material that sits atop the AFM tab to equal a thickness of the electrode.

2. The magnetic head of claim 1, wherein the SAF, free, and spacer layers each share a common stripe height.

3. The magnetic head of claim 2, wherein the at least one AFM tab has a reduced stripe height that is less than the common stripe height.

4. The magnetic head of claim 1, further comprising at least one magnetic shield coupled to a selected side of the lamination.

5. The magnetic head of claim 4, wherein the at least one magnetic shield has a greater stripe height than the AFM tab.

6. The magnetic head of claim 1, wherein the SAF has a first stripe height and the spacer and free layers each have a second stripe height that is less than the first stripe height.

7. The magnetic head of claim 6, wherein the AFM tab has a third stripe height that is greater than the difference between the first and second stripe heights so that the AFM tab overlaps an areal extent of the free layer.

8. The magnetic head of claim 1, wherein the SAF layer is a lamination of a transition metal disposed between a pair of ferromagnetic sub-layers.

9. The magnetic head of claim 1, wherein the AFM tab has a first thickness and the SAF layer has a second thickness, the first thickness being greater than the second thickness.

10. The magnetic head of claim 1, wherein the AFM tab is laterally adjacent the free layer so that the combined stripe heights of the free layer and AFM tab equal a stripe height of the entire SAF layer.

11. The magnetic head of claim 1, wherein the PW50 width of the lamination is increased as a result of the AFM tab being vacant from the ABS.

12. A magnetic transducing element comprising:
   a magnetically responsive lamination with a uniform lamination thickness comprising a ferromagnetic free layer separated from a synthetic antiferromagnetic (SAF) layer by a spacer layer and from a sensed data bit stored in an adjacent medium by an air bearing surface (ABS); and
   an antiferromagnetic (AFM) tab incorporated into the magnetically responsive lamination and uniform lamination thickness, the AFM tab directly coupled to the SAF layer a predetermined offset distance from the ABS and separated from an electrode by an insulating material that sits atop the AFM tab to equal a thickness of the electrode, the tab configured to provide exchange coupling that maintains a predetermined set magnetization in the SAF layer.

13. The magnetic transducing element of claim 12, characterized as a read sensor in a data transducing head.

14. The magnetic transducing element of claim 12, wherein a metallic AFM material is deposited onto an anisotropic etch of the SAF layer.

15. The magnetic element of claim 12, wherein a common insulating material contacts the AFM tab, free layer, and spacer layer while separating the AFM tab from the free and spacer layers.

16. The magnetic transducing element of claim 12, wherein an oxide AFM material is laterally deposited onto the SAF layer in direct contacting adjacency with the free and spacer layers.

17. The magnetic transducing element of claim 12, wherein the electrode has a greater thickness than the AFM tab.

18. A method comprising:
   separating a ferromagnetic free layer from a synthetic antiferromagnetic (SAF) layer in a magnetoresistive lamination by a spacer layer and from a sensed data bit stored in an adjacent medium by an air bearing surface (ABS), the magnetoresistive lamination having a uniform lamination thickness; and
   incorporating at least one antiferromagnetic (AFM) tab into the magnetoresistive lamination and uniform lamination thickness, the AFM tab directly coupled to the SAF a predetermined offset distance from the ABS and separated from an electrode by an insulating material that sits atop the AFM tab to equal a thickness of the electrode.

19. The method of claim 18, wherein the AFM tab is positioned inside the bounds of a stripe height of the SAF layer.

20. The method of claim 18, wherein the AFM tab maintains a predetermined set magnetization of the SAF layer in response to an external magnet field.

* * * * *